(12) United States Patent
Edelstein et al.

(10) Patent No.: US 10,217,809 B2
(45) Date of Patent: Feb. 26, 2019

(54) METHOD OF FORMING RESISTORS WITH CONTROLLED RESISTIVITY

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/814,029

(22) Filed: Nov. 15, 2017

(65) Prior Publication Data

US 2018/0197939 A1  Jul. 12, 2018

Related U.S. Application Data

(63) Continuation of application No. 15/403,946, filed on Jan. 11, 2017, now Pat. No. 9,991,330.

(51) Int. Cl.
*H01L 21/00* (2006.01)
*H01L 49/02* (2006.01)
(Continued)

(52) U.S. Cl.
CPC ............. *H01L 28/24* (2013.01); *H01C 7/006* (2013.01); *H01C 17/075* (2013.01);
(Continued)

(58) Field of Classification Search
CPC ........ H01C 7/006; H01C 7/18; H01C 17/075; H01C 17/06526; H01C 17/265;
(Continued)

(56) References Cited

U.S. PATENT DOCUMENTS 5,410,913 A  5/1995  Blackburn
5,485,138 A  1/1996  Morris
(Continued)

OTHER PUBLICATIONS

S.-M. Na, et al., "Electrical and structural properties of Ta—N thin film and Ta/Ta—N multilayer for embedded resistor", Thin Solid Films, Available online Jul. 13, 2007, pp. 5465-5469, 516.
(Continued)

*Primary Examiner* — Nikolay Yushin
(74) *Attorney, Agent, or Firm* — Scully, Scott, Murphy & Presser, P.C.; Steven J. Meyers

(57) ABSTRACT

The present application provides planar and stacked resistor structures that are embedded within an interconnect dielectric material in which the resistivity of an electrical conducting resistive material or electrical conducting resistive materials of the resistor structure can be tuned to a desired resistivity during the manufacturing of the resistor structure. Notably, a doped metallic insulator layer is formed atop a substrate. A controlled surface treatment process is then performed to an upper portion of the doped metallic insulator layer to convert the upper portion of the doped metallic insulator layer into an electrical conducting resistive material layer. The remaining doped metallic insulator layer and the electrical conducting resistive material layer are then patterned to provide the resistor structure.

17 Claims, 7 Drawing Sheets

(51) Int. Cl.
   *H01C 17/075* (2006.01)
   *H01C 7/00* (2006.01)
   *H01L 23/522* (2006.01)
   *H01L 23/528* (2006.01)
   *H01L 23/532* (2006.01)
   *H01L 21/321* (2006.01)
   *H01L 21/02* (2006.01)
   *H01L 21/768* (2006.01)
   *H01L 21/3205* (2006.01)

(52) U.S. Cl.
   CPC ...... *H01L 21/02183* (2013.01); *H01L 21/321* (2013.01); *H01L 21/32051* (2013.01); *H01L 21/7684* (2013.01); *H01L 21/76802* (2013.01); *H01L 21/76823* (2013.01); *H01L 21/76834* (2013.01); *H01L 21/76846* (2013.01); *H01L 21/76877* (2013.01); *H01L 23/528* (2013.01); *H01L 23/5228* (2013.01); *H01L 23/5329* (2013.01); *H01L 23/53238* (2013.01)

(58) Field of Classification Search
   CPC .............. H01C 7/022; H01L 21/02183; H01L 21/32051; H01L 21/321; H01L 21/76802; H01L 21/76823; H01L 21/76834; H01L 21/7684; H01L 21/76846; H01L 21/76877; H01L 23/5228; H01L 23/528; H01L 23/53238; H01L 23/5329; H01L 28/24; H01L 28/20
   See application file for complete search history.

(56) References Cited

U.S. PATENT DOCUMENTS

| | | | |
|---|---|---|---|
| 6,083,785 A | 7/2000 | Segawa et al. | |
| 6,207,560 B1 | 3/2001 | Lee | |
| 6,232,042 B1 | 5/2001 | Dunn et al. | |
| 6,433,429 B1 | 8/2002 | Stamper | |
| 6,437,440 B1 | 8/2002 | Cabral, Jr. et al. | |
| 6,440,807 B1 | 8/2002 | Ajmera et al. | |
| 6,534,360 B2 | 3/2003 | Narwankar et al. | |
| 6,665,033 B2 | 12/2003 | Callegari et al. | |
| 6,951,804 B2 | 10/2005 | Seutter et al. | |
| 7,057,490 B2 | 6/2006 | Hashimoto et al. | |
| 7,314,786 B1 | 1/2008 | Yang et al. | |
| 7,345,503 B2 | 3/2008 | Chen et al. | |
| 7,928,006 B2 | 4/2011 | Besling | |
| 8,013,394 B2 * | 9/2011 | Chinthakindi | H01L 21/76895 257/358 |
| 8,962,473 B2 | 2/2015 | Kuo et al. | |
| 2002/0146915 A1 | 10/2002 | Narwankar et al. | |
| 2004/0027234 A1 | 2/2004 | Hashimoto et al. | |
| 2006/0081962 A1 | 4/2006 | Wei et al. | |
| 2006/0148253 A1 | 7/2006 | Chung et al. | |
| 2007/0046421 A1 | 3/2007 | Gogineni | |
| 2008/0237800 A1 * | 10/2008 | Chinthakindi | H01L 21/76895 257/537 |
| 2008/0251921 A1 | 10/2008 | Besling | |
| 2013/0234284 A1 | 9/2013 | Bonilla et al. | |
| 2014/0008764 A1 * | 1/2014 | Yang | H01L 23/5228 257/537 |
| 2014/0264867 A1 | 9/2014 | Kuo et al. | |
| 2016/0020148 A1 | 1/2016 | Song et al. | |
| 2017/0154950 A1 | 6/2017 | Basker et al. | |

OTHER PUBLICATIONS

A. Scandurra, et al., "Tantalum nitride thin film resistors by low temperature reactive sputtering for plastic electronics", Surf. Interface Anal., Published online in Wiley Interscience: Feb. 20, 2008, pp. 758-762m, 40.

List of IBM Patents or Patent Applications Treated as Related dated Nov. 15, 2017, 2 pages.

Office Action dated Apr. 4, 2018 received in U.S. Appl. No. 15/799,435.

Office Action dated Apr. 12, 2018 received in U.S. Appl. No. 15/799,378.

Office Action dated Oct. 16, 2018 received in U.S. Appl. No. 15/814,057.

* cited by examiner

METHOD OF FORMING RESISTORS WITH CONTROLLED RESISTIVITY

BACKGROUND

The present application relates to a semiconductor structure and a method of forming the same. More particularly, the present application relates to a semiconductor structure that includes a resistor structure that is embedded in an interconnect dielectric material and that has a controlled resistivity. The present application also provides a method of forming such a semiconductor structure.

A resistor, which is a passive two-terminal electrical component that implements electrical resistance as a circuit element, is one of the most common electrical components present in almost every electrical device. In electronic circuits, resistors can be used to limit current flow, to adjust signal levels, bias active elements, and terminate transition lines.

In semiconductor devices, it is well known to have a thin film resistor such as, for example, a resistor composed of TaN, embedded in the chip through either a damascene approach or a subtractive etch method. For example, and during back-end-of-the-line (BEOL) processing, a thin film resistor may be embedded in an interconnect dielectric material. Prior art methods of forming thin film resistors embedded in an interconnect dielectric material are complicated and expensive. Moreover, topography issues arise when embedding a thin film resistor in an interconnect dielectric material which may degrade the final chip yield. Other issues with prior art methods of embedding a thin film metal resistor in a MOL dielectric material include variation of sheet resistivity and tuning precision.

There is thus a need for providing a semiconductor structure including a resistor structure that is embedded in an interconnect dielectric material that has design flexibility and controlled resistivity.

SUMMARY

The present application provides planar and stacked resistor structures that are embedded within an interconnect dielectric material in which the resistivity of an electrical conducting resistive material or electrical conducting resistive materials of the resistor structure can be tuned to a desired resistivity during the manufacturing of the resistor structure. Notably, a doped metallic insulator layer is formed atop a substrate. A controlled surface treatment process is then performed to an upper portion of the doped metallic insulator layer to convert the upper portion of the doped metallic insulator layer into an electrical conducting resistive material layer. The remaining doped metallic insulator layer and the electrical conducting resistive material layer are then patterned to provide the resistor structure.

In one aspect of the present application, a semiconductor structure including a resistor structure that is embedded in an interconnect dielectric material and that has a controlled resistivity is provided. In one embodiment, the semiconductor structure may include a resistor structure located on a surface of a substrate. The resistor structure includes an electrical conducting resistive material located on a doped metallic insulator. The electrical conducting resistive material is selected from the group consisting of a metallic nitride, a metallic oxide, and a metallic nitride-oxide (i.e., a metallic complex containing both oxide and nitride). The semiconductor structure of the present application further includes an interconnect dielectric material entirely embedding the resistor structure.

In some embodiments, the resistor structure may further include a base electrical conducting resistive material located directly beneath the doped metallic insulator. In such an embodiment, the base electrical conducting resistive material is also selected from the group consisting of a metallic nitride, a metallic oxide, and a metallic nitride-oxide.

In another aspect of the present application, a method of forming a semiconductor structure including a resistor structure that is embedded in an interconnect dielectric material and that has a controlled resistivity is provided. In one embodiment, the method includes forming a doped metallic insulator layer atop a substrate. A controlled surface treatment process is then performed to an upper portion of the doped metallic insulator layer to convert the upper portion of the doped metallic insulator layer into an electrical conducting resistive material layer, the electrical conducting resistive material layer is selected from the group consisting of a metallic nitride, a metallic oxide, and a metallic nitride-oxide (i.e., a metallic complex containing both oxide and nitride). The doped metallic insulator layer and the electrical conducting resistive material layer are then patterned to provide a resistor structure comprising a remaining portion of the doped metallic insulator layer and a remaining portion of the electrical conducting resistive material layer. An interconnect dielectric material is then formed on the substrate and the resistor structure.

In some embodiments, the method may further include forming a base electrical conducting resistive material layer between the substrate and the doped metallic insulator layer, the base electrical conducting resistive material layer is selected from the group consisting of a metallic nitride, a metallic oxide, and a metallic nitride-oxide. In such an embodiment, the base electrical conducting resistive material layer is patterned during the patterning of the doped metallic insulator layer and the electrical conducting resistive material layer, and the resistor structure comprises a remaining portion of the base electrical conducting resistive material layer, a remaining portion of the doped metallic insulator layer and a remaining portion of the electrical conducting resistive material layer.

DETAILED DESCRIPTION

Figure 1:
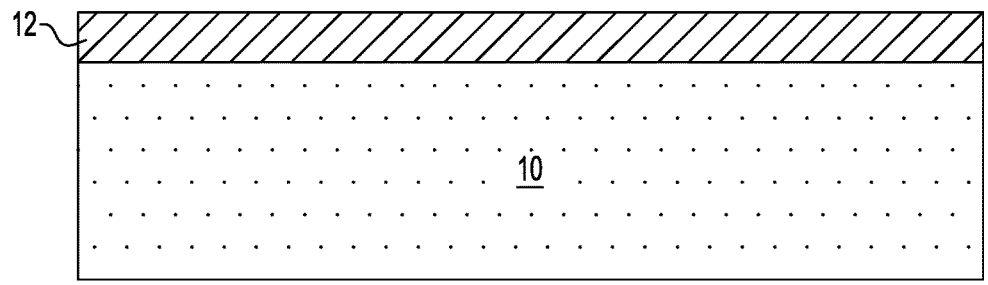
FIG. 1 is a cross sectional view of a first exemplary semiconductor structure that includes a doped metallic insulator layer located on a surface of a substrate in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Referring now to FIG. 1, there is illustrated a first exemplary semiconductor structure that can be employed in accordance with an embodiment of the present application. The first exemplary semiconductor structure includes a doped metallic insulator layer 12 located on a surface of a substrate 10.

Substrate 10 may be composed of a semiconductor material, an insulator material, a conductive material or any combination thereof. When the substrate 10 is composed of a semiconductor material, any material having semiconducting properties such as, for example, Si, SiGe, SiGeC, SiC, Ge alloys, III/V compound semiconductors or II/VI compound semiconductors, may be used. In addition to these listed types of semiconductor materials, substrate 10 can be a layered semiconductor such as, for example, Si/SiGe, Si/SiC, silicon-on-insulators (SOIs) or silicon germanium-on-insulators (SGOIs).

When the substrate 10 is an insulator material, the insulator material can be an organic insulator, an inorganic insulator or any combination thereof including multilayers. When substrate 10 is a conductive material, substrate 10 may include, for example, polySi, an elemental metal, alloys of elemental metals, a metal silicide, a metal nitride or any combination thereof including multilayers.

When substrate 10 is composed of a semiconductor material, one or more semiconductor devices such as, for example, complementary metal oxide semiconductor (CMOS) devices can be fabricated thereon. When substrate 10 is composed of a combination of an insulator material and a conductive material, substrate 10 may represent an underlying interconnect level of a multilayered interconnect structure.

Doped metallic insulator layer 12 is a continuous (without any voids and/or breaks) layer that is present on the entirety of the substrate 10. In one embodiment, doped metallic insulator layer 12 may include a nitrogen-doped metal that is composed of nitrogen, N, and a metal, M. In another embodiment, doped metallic insulator layer 12 may include an oxygen-doped metal that is composed of oxygen, O, and a metal, M. In yet another embodiment, doped metallic insulator layer 12 may include a nitrogen- and oxygen-doped metal that is composed of nitrogen, N, oxygen, O, and a metal M. In any of the above mentioned embodiments, metal, M, is a ohmic material such as, for example, titanium (Ti), tantalum (Ta), ruthenium (Ru), tungsten (W), platinum (Pt), cobalt (Co), rhodium (Rh) and manganese (Mn). In one example, the doped metallic insulator layer 12 is $Ta_3N_5$. In any of the above mentioned embodiments, the ratio of nitrogen and/or oxygen to metal in the doped metallic insulator layer 12 provides a crystal structure having an insulating phase, which upon performing a subsequent controlled surface treatment is converted into an electrical conducting phase.

Doped metallic insulator layer 12 may be formed utilizing a deposition process such as, for example, chemical vapor deposition (CVD), plasma enhanced chemical vapor deposition (PECVD), atomic layer deposition (ALD), physical vapor deposition (PVD), sputtering, chemical solution deposition or plating.

Doped metallic insulator layer 12 may have a thickness of from 5 nm to 50 nm. Other thicknesses that are lesser than 5 nm, or greater than 50 nm can also be employed as the thickness of the doped metallic insulator layer 12.

Figure 2:
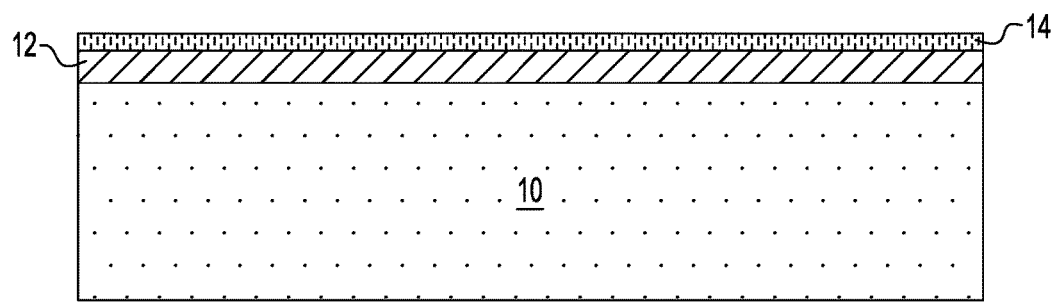
FIG. 2 is a cross sectional view of the first exemplary semiconductor structure of FIG. 1 after performing a controlled surface treatment in which an upper portion of the doped metallic insulator layer is converted into an electrical conducting metallic nitride and/or oxide layer.

Referring now to FIG. 2, there is illustrated the first exemplary semiconductor structure of FIG. 1 after performing a controlled surface treatment in which an upper portion of the doped metallic insulator layer 12 is converted into an electrical conducting metallic nitride and/or oxide layer 14. The term "metallic nitride and/or oxide" denotes a metallic nitride, a metallic oxide, or a metallic nitride-oxide. The electrical conducting metallic nitride and/or oxide layer 14 includes the same metal as the doped metallic insulator layer 12. In one example, the electrical conducting metallic nitride and/or oxide layer 14 is TaN. The electrical conductive metallic nitride and/or oxide layer 14 may also be referred to herein as an electrical conducting resistive material layer.

The controlled surface treatment process may include introducing atoms of nitrogen ($N_2$), atoms of oxygen ($O_2$), atoms of hydrogen ($H_2$), atoms of argon (Ar) or any combination of the aforementioned atoms into the upper portion of the doped metallic insulator layer 12 such that the insulating phase of the exposed portion of the doped metallic insulator layer 12 is converted into a crystal structure having an electrical conducting phase. In one embodiment, after the controlled surface treatment process, the ratio of oxygen and/or nitrogen in the upper portion of the doped metallic insulator layer 12 is changed such that the upper portion of the doped metallic insulator layer 12 is converted from insulating to conducting. In one example, the doped insulator layer 12 is $Ta_3N_5$, and the resulting electrical conducting resistive material (i.e., the electrical conducting nitride and/or oxide layer 14) is TaN.

The controlled surface treatment process changes the composition of the exposed upper portion of the doped metallic insulator layer 12 into an electrical conducting metallic material. Tuning of the resistivity of the resultant electrical conducting metallic material, i.e., the electrical conducting metallic nitride and/or oxide layer 14, can be achieved by adjusting the depth of the controlled surface treatment process. In one embodiment of the present application, the controlled surface treatment converts from 1 nm to 3 nm of the doped metallic insulator layer 12 into the electrical conducting resistive material. Other depths are possible as long as at least a portion of the doped metallic insulator layer 12 remains after the controlled surface treatment process.

The controlled surface treatment may include, but is not limited to, a thermal process, a plasma process, a gas cluster ion beam process, an ion beam process or an ion implantation process.

The thermal process may include thermal treatments in an ambient containing at least one of nitrogen ($N_2$), oxygen ($O_2$), hydrogen ($H_2$), and argon (Ar). In one example, the thermal treatments may include a thermal nitridation, and/or a thermal oxidation. The thermal processes do not include an electrical bias higher than 200 W. The thermal processes may include a laser beam treatment. In some embodiments, no electrical bias is performed during the thermal processes.

In one example, and when a thermal nitridation process is employed, the thermal nitridation process can be performed in any nitrogen-containing ambient, which is not in the form of a plasma. The nitrogen-containing ambients that can be employed in the present application include, but are not limited to, $N_2$, $NH_3$, $NH_4$, NO, or $NH_x$ wherein x is between 0 and 1. Mixtures of the aforementioned nitrogen-containing ambients can also be employed in the present application. In some embodiments, the nitrogen-containing ambient is used neat, i.e., non-diluted. In other embodiments, the nitrogen-containing ambient can be diluted with an inert gas such as, for example, helium (He), neon (Ne), argon (Ar) and mixtures thereof. In some embodiments, hydrogen ($H_2$) can be used to dilute the nitrogen-containing ambient.

In another example, and when a thermal oxidation process is employed, the thermal oxidation process can be performed in any oxygen-containing ambient, which is not in the form of a plasma. In one example, ozone ($O_3$) is employed as the oxygen-containing ambient. Other oxygen containing ambients may also be employed. Mixtures of the aforementioned oxygen-containing ambients can also be employed in the present application. In some embodiments, the oxygen-containing ambient is used neat, i.e., non-diluted. In other embodiments, the oxygen-containing ambient can be diluted with an inert gas such as, for example, helium (He), neon (Ne), argon (Ar) and mixtures thereof. In some embodiments, hydrogen ($H_2$) can be used to dilute the oxygen-containing ambient.

When a combined thermal nitridation and oxidation process is employed, a combination of nitrogen-containing and oxygen containing ambients used neat or admixed with an inert gas or hydrogen can be employed.

In the specific examples mentioned above (i.e., thermal oxidation and/or thermal nitridation), the content of nitrogen ($N_2$) and/or oxygen ($O_2$) within the ambient employed in the present application is typically from 10% to 100%, with a nitrogen and/or oxygen content within the ambient from 50% to 80% being more typical. In one embodiment, the thermal processes employed in the present application is performed at a temperature from 50° C. to 600° C.

Hydrogen ($H_2$) or argon (Ar) thermal processes can be performed neat or diluted and the amounts of hydrogen ($H_2$) or argon (Ar) in such thermal processes can also be in the range from 10% to 100%.

When a plasma process is used, an electrical bias of greater than 200 W can be employed. The plasma process is performed by generating a plasma from one of the ambients (neat or diluted) that are mentioned above for the thermal process; notably a plasma containing at least one of nitrogen ($N_2$), oxygen ($O_2$), hydrogen ($H_2$), and argon (Ar) is provided and used during the controlled surface treatment process. In one embodiment, the plasma process employed in the present application is performed at a temperature from 50° C. to 600° C.

When an ion beam process is employed, a beam of at least one of nitrogen ($N_2$) ions, oxygen ($O_2$) ions, hydrogen ($H_2$) ions, and argon (Ar) ions generated from an ion source such as one of the aforementioned ambients is impinged upon the doped metallic insulator layer 12. The ion beam process may be performed utilizing any ion beam apparatus. The energy of the ion beam process can from 10 eV to 100 eV. The ion beam process can be performed at a temperature from 50° C. to 600° C.

When a gas cluster ion beam process is employed, a cluster of at least one of nitrogen ($N_2$) ions, oxygen ($O_2$)

ions, hydrogen (H$_2$) ions, and argon (Ar) ions generated from an ion source such as one of the aforementioned ambients is impinged upon the doped metallic insulator layer 12. The gas cluster ion beam process may be performed utilizing any gas cluster ion beam apparatus. The energy of the gas cluster ion beam process can from 10 eV to 30 eV. The gas cluster ion beam process can be performed at a temperature from 50° C. to 600° C.

When ion implantation is employed, at least one of nitrogen (N$_2$) ions, oxygen (O$_2$) ions, hydrogen (H$_2$) ions, and argon (Ar) ions generated from an ion source such as one of the aforementioned ambients are impinged upon the doped metallic insulator layer 12. The ion implantation process may be performed utilizing any ion implantation apparatus. The energy of the ion implantation process can from 10 eV to 200 eV. The ion implantation process can be performed at a temperature from 50° C. to 600° C.

Figure 3:
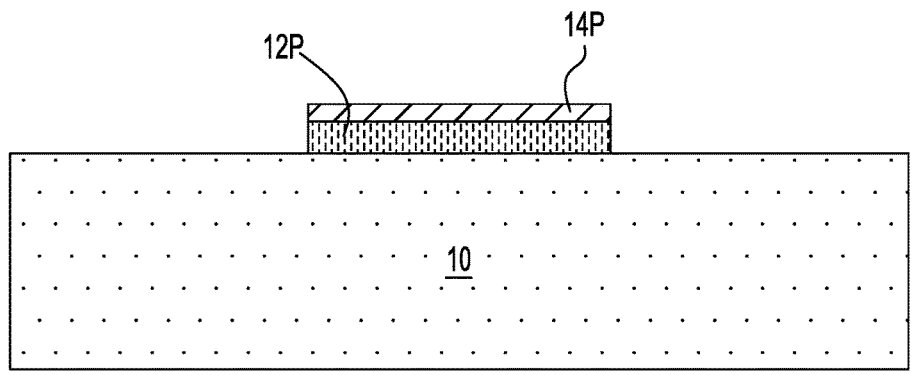
FIG. 3 is a cross sectional view of the first exemplary semiconductor structure of FIG. 2 after patterning the bilayer of the remaining portion of the doped metallic insulator layer and the electrical conducting metallic nitride and/or oxide layer to provide a resistor structure on the substrate.

Referring now to FIG. 3, there is illustrated the first exemplary semiconductor structure of FIG. 2 after patterning the bilayer of the remaining portion of the doped metallic insulator layer 12 and the electrical conducting metallic nitride and/or oxide layer 14 to provide a resistor structure on the substrate 10. In the illustrated embodiment, resistor structure consists of an electrical conducting metallic nitride and/or oxide 14P (element 14P is a portion of the electrical conducting metallic nitride and/or oxide layer 14 that remains after the patterning process) located on a doped metallic insulator 12P (element 12P is a portion of the doped metallic insulator layer 12 that remains after the patterning process). Electrical conducting metallic nitride and/or oxide 14P is an electrical conducting resistive material of the resistor structure shown in FIG. 3.

As shown, outer sidewalls of the electrical conducting metallic nitride and/or oxide 14P of the resistor structure are vertically aligned with the outer sidewalls of the doped metallic insulator 12P. Thus, the length of the electrical conducting metallic nitride and/or oxide 14P is the same as a length of the underlying doped metallic insulator 12P. In this embodiment, the resistor structure includes a planar electrical conducting resistive material, i.e., the electrical conducting metallic nitride and/or oxide 14P, located on the doped metallic insulator 12P.

In one embodiment, patterning may include lithography and etching. The lithographic process includes forming a photoresist (not shown) atop a material or material stack to be patterned, exposing the photoresist to a desired pattern of radiation and developing the exposed photoresist utilizing a conventional resist developer. The photoresist may be a positive-tone photoresist, a negative-tone photoresist or a hybrid-tone photoresist. The photoresist may be formed utilizing a deposition process such as, for example, spin-on coating. The etching process includes a dry etching process (such as, for example, reactive ion etching, ion beam etching, plasma etching or laser ablation), and/or a wet chemical etching process. Typically, reactive ion etching is used in providing the resistor structure (12P, 14P) shown in FIG. 3.

Figure 4:
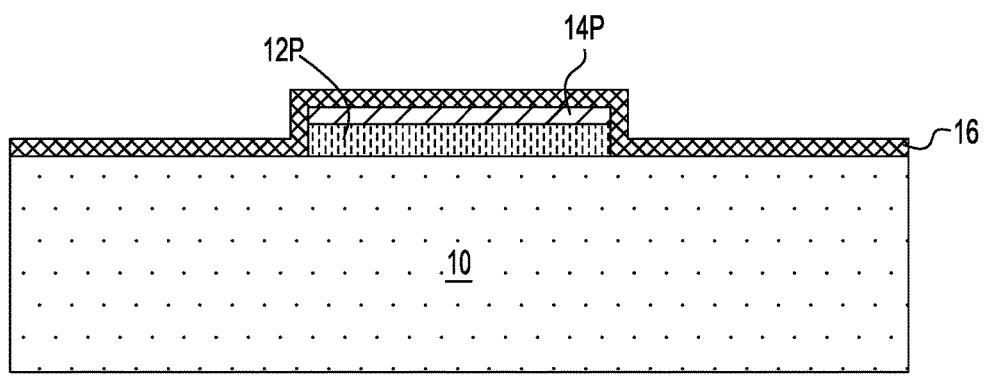
FIG. 4 is a cross sectional view of the first exemplary semiconductor structure of FIG. 3 after forming a dielectric capping layer on physically exposed portions of the substrate and the resistor structure.

Referring now to FIG. 4, there is illustrated the first exemplary semiconductor structure of FIG. 3 after forming a dielectric capping layer 16 on physically exposed portions of the substrate 10 and the resistor structure (12P/14P). Notably, the dielectric capping layer 16 is formed directly on physically exposed portions of the topmost surface of substrate 10 as well as sidewall surfaces and a topmost surface of the resistor structure (12P/14P). In some embodiments, the formation of the dielectric capping layer 16 may be omitted.

When present, the dielectric capping layer 16 may include any dielectric capping material such as, for example, silicon carbide (SiC), silicon nitride (Si$_3$N$_4$), silicon dioxide (SiO$_2$), a carbon doped oxide, a nitrogen and hydrogen doped silicon carbide (SiC(N,H)) or a multilayered stack of at least one of the aforementioned dielectric capping materials. The dielectric capping material that provides the dielectric capping layer 16 may be formed utilizing a deposition process such as, for example, chemical vapor deposition (CVD), plasma enhanced chemical vapor deposition (PECVD), atomic layer deposition (ALD), chemical solution deposition or evaporation.

When present, dielectric capping layer 16 may have a thickness from 10 nm to 100 nm. Other thicknesses that are lesser than 10 nm, or greater than 100 nm may also be used as the thickness of the dielectric capping layer 16.

Figure 5:
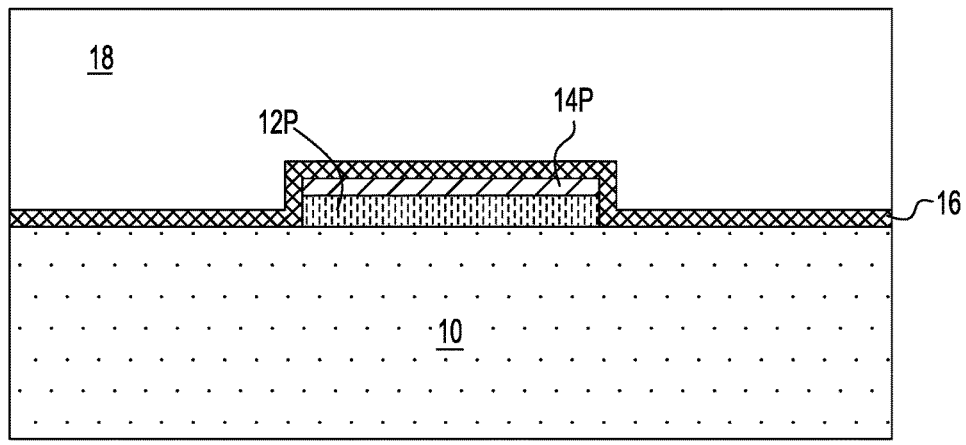
FIG. 5 is a cross sectional view of the first exemplary semiconductor structure of FIG. 4 after forming an interconnect dielectric material on the dielectric capping layer.

Referring now to FIG. 5, there is illustrated the first exemplary semiconductor structure of FIG. 4 after forming an interconnect dielectric material 18 on the dielectric capping layer 16. In embodiments in which no dielectric capping layer 16 is formed, the interconnect dielectric material 18 is formed on the physically exposed surfaces of the substrate 10 and resistor structure (12P/14P).

The interconnect dielectric material 18 may be composed of an inorganic dielectric material or an organic dielectric material. In some embodiments, the interconnect dielectric material 18 may be porous. In other embodiments, the interconnect dielectric material 18 may be non-porous. Examples of suitable dielectric materials that may be employed as the interconnect dielectric material 18 include, but are limited to, silicon dioxide, undoped or doped silicate glass, silsesquioxanes, C doped oxides (i.e., organosilicates) that include atoms of Si, C, O and H, theremosetting polyarylene ethers or any multilayered combination thereof. The term "polyarylene" is used in this present application to denote aryl moieties or inertly substituted aryl moieties which are linked together by bonds, fused rings, or inert linking groups such as, for example, oxygen, sulfur, sulfone, sulfoxide, or carbonyl.

The interconnect dielectric material 18 may have a dielectric constant (all dielectric constants mentioned herein are measured relative to a vacuum, unless otherwise stated) that is about 4.0 or less. In one embodiment, the interconnect dielectric material 18 has a dielectric constant of 2.8 or less. These dielectrics generally having a lower parasitic cross talk as compared to dielectric materials whose dielectric constant is greater than 4.0.

The interconnect dielectric material 18 may be formed by a deposition process such as, for example, chemical vapor deposition (CVD), plasma enhanced chemical vapor deposition (PECVD) or spin-on coating. The interconnect dielectric material 18 may have a thickness from 50 nm to 250 nm. Other thicknesses that are lesser than 50 nm, and greater than 250 nm can also be employed as long as the interconnect dielectric material 18 entirely embeds the resistor structure (12P/14P) provided above. That is, the interconnect dielectric material must cover the entire resistor structure (12P/14P).

Figure 6:
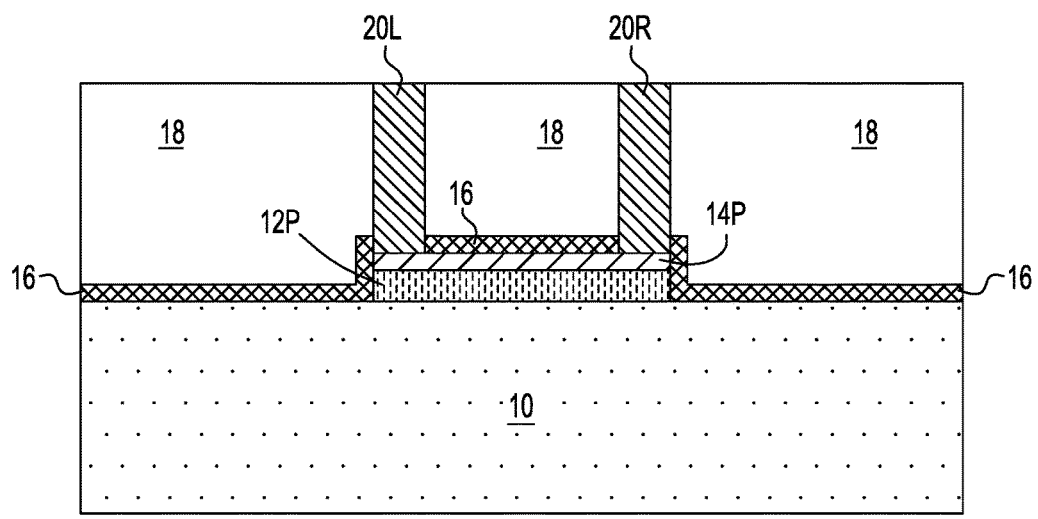
FIG. 6 is a cross sectional view of the first exemplary semiconductor structure of FIG. 5 after forming a first contact structure and a second contact structure that contact different portions of the topmost surface of the resistor structure.

Referring now to FIG. 6, there is illustrated the first exemplary semiconductor structure of FIG. 5 after forming a first contact structure 20L and a second contact structure 20R that contact different portions of the topmost surface of the resistor structure (12P/14P). Notably, the first contact structure 20L contacts a first portion of the electrical conducting metallic nitride and/or oxide 14P, while the second contact structure 29R contacts a second portion of the electrical conducting metallic nitride and/or oxide 14P.

The first contact structure 20L and the second contact structure 20R are spaced apart from each other. In the illustrated embodiment shown in FIG. 6, the first contact structure 20L is located at a first end portion of the resistor structure (12P/14P), while the second contact structure 20R is located at a second end portion of the resistor structure (12P, 14P).

The first and second contact structures (20L, 20R) can be formed by first providing contact openings into the interconnect dielectric material 18 and, if present, the dielectric capping layer 16. Each of the contact openings physically expose different portions of the topmost surface of the electrical conducting metallic nitride and/or oxide 14P. Each contact opening may be formed by lithography and etching as defined above. After providing the contact openings, each contact opening is then filled, at least in part, with a contact metal or metal alloy. The contact metal or metal alloy that provides at least a portion of the contact structures (20L, 20R) may include tungsten (W), cobalt (Co), aluminum (Al), copper (Cu), or a copper-aluminum alloy (in such an alloy copper may compose a majority (i.e., greater than 50 atomic percent) of the alloy, aluminum may compose a majority (i.e., greater than 50 atomic percent) of the alloy, or copper and aluminum are present in equal amounts (i.e., both elements are present at 50 atomic percent)).

The contact metal or metal alloy that provides at least a portion of the contact structures (20L, 20R) can be formed by a deposition process such as, for example, chemical vapor deposition (CVD), plasma enhanced chemical vapor deposition (PECVD), sputtering or plating. In some embodiments, a planarization process may follow the deposition of the contact metal or metal alloy. In the illustrated embodiment, the first and second contact structures (20L, 20R) have a topmost surface that is coplanar with each as well as being coplanar with a topmost surface of the interconnect dielectric material 18.

Figure 7:
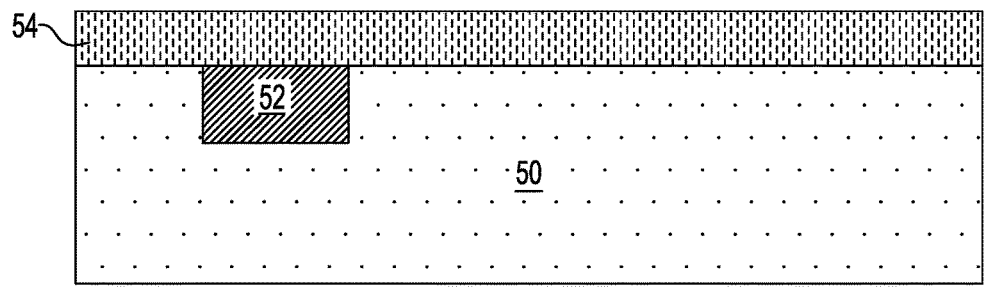
FIG. 7 is a cross sectional view of a second exemplary semiconductor structure that includes a doped metallic insulator layer located on a surface of a dielectric substrate in accordance with another embodiment of the present application.

Referring now to FIG. 7, there is illustrated a second exemplary semiconductor structure that can be employed in accordance with another embodiment of the present application. In this embodiment, the second exemplary semiconductor structure includes a doped metallic insulator layer 54 located on a surface of a dielectric substrate 50. A least one interconnect structure 52 is embedded within the dielectric substrate 50.

Dielectric substrate 50 may include one of the dielectric materials mentioned above for interconnect dielectric material 18. Dielectric substrate 50 may be formed utilizing one of the deposition processes mentioned above for forming interconnect dielectric material 18. Dielectric substrate 50 may have a thickness that is within the range mentioned above for interconnect dielectric material 18.

The at least one interconnect structure 52 that is embedded within the dielectric substrate 50 may include an interconnect metal or metal alloy such as, for example, copper (Cu), aluminum (Al), tungsten (W), a copper-aluminum alloy (Cu—Al as defined above), or a copper-manganese alloy (Cu—Mn). The at least one interconnect structure 52 may be formed by first providing at least one opening within the dielectric substrate 50 and then filling the at least one opening with an interconnect metal or metal alloy as defined above. The at least one opening can be formed utilizing lithography and etching as defined above. The at least one opening may be a via opening, a line opening, or a combined via/line opening.

The filling may include a deposition process such as, for example, chemical vapor deposition (CVD), plasma enhanced chemical vapor deposition (PECVD), sputtering, or plating. A planarization process may follow the deposition of the interconnect metal or metal alloy to remove any overburdened interconnect metal or metal alloy that is formed on the topmost surface of the dielectric substrate 50.

Prior to depositing the interconnect metal or metal alloy, a diffusion barrier material (not shown) such as, for example, tantalum (Ta), tantalum nitride (TaN), titanium (Ti), titanium nitride (TiN), ruthenium (Ru), ruthenium nitride (RuN), a ruthenium-tantalum alloy (RuTa), a ruthenium-tantalum nitride alloy (RuTaN) tungsten (W), or tungsten nitride (WN) can be formed along the sidewalls and bottom wall of each opening. The diffusion barrier material must be different from the interconnect metal or metal alloy so as to serve as a barrier material. The diffusion barrier material can be formed utilizing a deposition process.

In some embodiments (not shown), a plating seed layer can be formed within the at least one opening. The plating seed layer may be used alone or in conjugation with the diffusion barrier material. The plating seed layer is employed to selectively promote subsequent electroplating of the interconnect metal or metal alloy. The optional plating seed layer may be composed of copper (Cu), a copper alloy, iridium (Ir), an iridium alloy, ruthenium (Ru) or a ruthenium alloy. The optional plating seed layer has a low metal-plating overpotential. In one embodiment, a copper plating seed layer can be used in facilitating the electroplating of a copper metal. The plating seed layer can be formed utilizing a deposition process.

In embodiments in which either a diffusion barrier material, a plating seed layer or both are employed, overburdened diffusion barrier material and/or plating seed may be removed from the topmost surface of the dielectric substrate 50 utilizing a planarization process that follows the deposition of the interconnect metal or metal alloy.

Doped metallic insulator layer 54 is a continuous (without any voids and/or breaks) layer that is present on the entirety of the dielectric substrate 50. Doped metallic insulator layer 54 of this embodiment is equivalent to doped metallic insulator layer 12 of the previous embodiment of the present application. In one embodiment, doped metallic insulator layer 54 may include a nitrogen-doped metal that is composed of nitrogen, N, and a metal, M. In another embodiment, doped metallic insulator layer 54 may include an oxygen-doped metal that is composed of oxygen, O, and a metal, M. In yet another embodiment, doped metallic insulator layer 54 may include a nitrogen- and oxygen-doped metal that is composed of nitrogen, N, oxygen, O, and a metal M. In any of the above mentioned embodiments, metal, M, is a ohmic material such as, for example, titanium (Ti), tantalum (Ta), ruthenium (Ru), tungsten (W), platinum (Pt), cobalt (Co), rhodium (Rh) and manganese (Mn). In one example, the doped metallic insulator layer 54 is $Ta_3N_5$.

Doped metallic insulator layer 54 may be formed utilizing one of the deposition processes mentioned above for doped metallic insulator layer 12. The doped metallic insulator layer 54 may have a thickness within the range mentioned above for doped metallic insulator layer 12.

Figure 8:
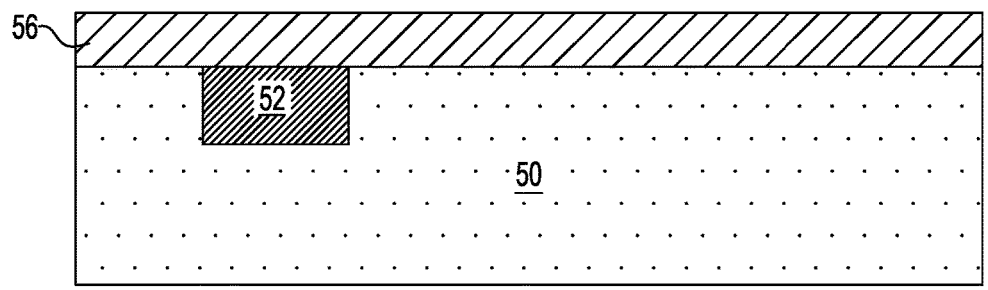
FIG. 8 is a cross sectional view of the second exemplary semiconductor structure of FIG. 7 after performing a controlled surface treatment in which the entirety of doped metallic insulator layer is converted into a base electrical conducting metallic nitride and/or oxide layer.

Referring now to FIG. 8, there is illustrated the second exemplary semiconductor structure of FIG. 7 after performing a controlled surface treatment in which the entirety of doped metallic insulator layer 54 is converted into a base electrical conducting metallic nitride and/or oxide layer 56 (i.e., a base electrical conducting resistive material). The base electrical conducting metallic nitride and/or oxide layer 56 includes the same metal as the doped metallic insulator layer 54.

The controlled surface treatment that can be used in this embodiment of the present application includes any of the previous mentioned controlled surface treatment processes that were mentioned above for converting only the upper portion of the doped metallic insulator into an electrical conducting metallic material. The controlled surface treatment that can be used in this embodiment may be performed for a greater duration than the controlled surface treatments mentioned above for converting only the upper portion of the doped metallic insulator into an electrical conducting metallic material. In this embodiment, the controlled surface treatment achieves entire conversion of the doped metallic insulator layer 54 into the base electrical conducting metallic nitride and/or oxide layer 56.

In some embodiments, the step of forming the doped metallic insulator layer 54 and controlled surface treatment processing can be omitted. In such an embodiment, an electrical conducting metallic nitride and/or oxide layer, which can be used as the base electrical conducting metallic nitride and/or oxide layer 56, is formed directly on the dielectric substrate 50 shown in FIG. 7. Notably, an electrical conducting metallic nitride and/or oxide layer, which can be used as the base electrical conducting metallic nitride and/or oxide layer 56, can be formed utilizing a deposition process such as, for example, chemical vapor deposition (CVD), plasma enhanced chemical vapor deposition (PECVD), atomic layer deposition (ALD), or sputtering.

Figure 9:
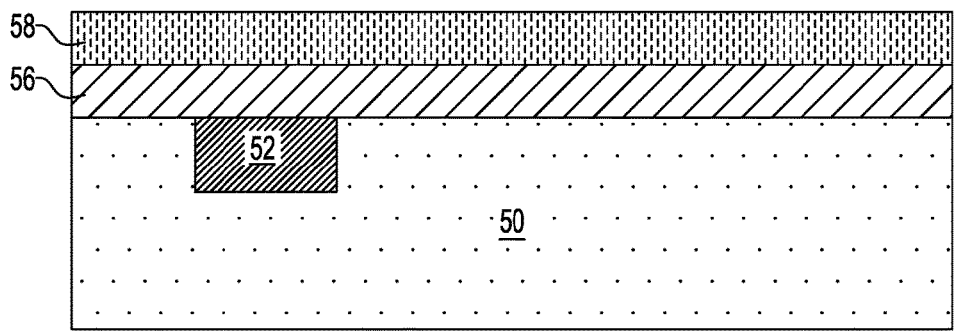
FIG. 9 is a cross sectional view of the second exemplary semiconductor structure of FIG. 8 after forming a second doped metallic insulator layer on the base electrical conducting metallic nitride and/or oxide layer.

Referring now to FIG. 9, there is illustrated the second exemplary semiconductor structure of FIG. 8 after forming a second doped metallic insulator layer 58 on the base electrical conducting metallic nitride and/or oxide layer 56. The second doped metallic insulator layer 58 may be composed of a same, or different, doped metallic insulator as doped metallic insulator layer 54. The second doped metallic insulator layer 58 may be formed utilizing one of the deposition processes mentioned above in forming doped metallic insulator layer 12. The second doped metallic insulator layer 58 may have a thickness within the range mentioned above for the doped metallic insulator layer 12.

Figure 10:
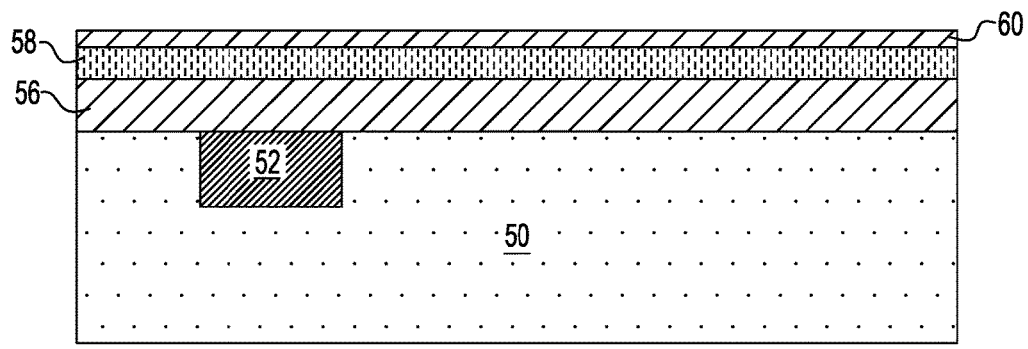
FIG. 10 is a cross sectional view of the second exemplary semiconductor structure of FIG. 9 after performing a controlled surface treatment in which an upper portion of the second doped metallic insulator layer is converted into an electrical conducting metallic nitride and/or oxide layer.

Referring now to FIG. 10, there is illustrated the second exemplary semiconductor structure of FIG. 9 after performing a controlled surface treatment in which an upper portion of the second doped metallic insulator layer 58 is converted into an electrical conducting metallic nitride and/or oxide layer 60. The metallic nitride and/or oxide layer 60 includes the same metal as the second doped metallic insulator layer 60.

The controlled surface treatment that can be used in this embodiment of the present application includes any of the previous mentioned surface treatment processes that were mentioned above for converting only the upper portion of the doped metallic insulator into an electrical conducting metallic material.

Figure 11:
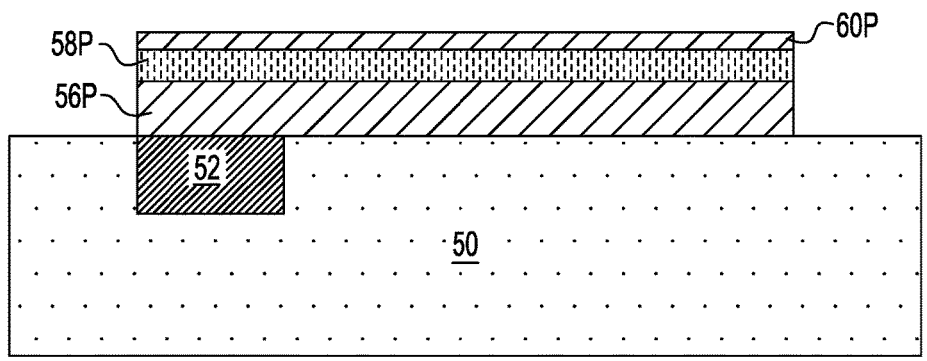
FIG. 11 is a cross sectional view of the second exemplary semiconductor structure of FIG. 10 after patterning the multilayered stack of the base electrical conducting metallic nitride and/or oxide layer, the remaining portion of the second doped metallic insulator layer, and the electrical conducting metallic nitride and/or oxide layer to provide a stacked resistor structure.

Referring now to FIG. 11, there is illustrated the second exemplary semiconductor structure of FIG. 10 after patterning the multilayered stack of the base electrical conducting metallic nitride and/or oxide layer 56, the remaining portion of the second doped metallic insulator layer 58, and the electrical conducting metallic nitride and/or oxide layer 60 to provide a stacked resistor structure. In this embodiment, resistor structure consists of, from bottom to top, a base electrical conducting metallic nitride and/or oxide 56P (element 56P is a portion of the base electrical conducting metallic nitride and/or oxide layer 56 that remains after the patterning process), a doped metallic insulator 58P (element 58P is a portion of the second doped metallic insulator layer 58 that remains after the patterning process) and an electrical conducting metallic nitride and/or oxide 60P (element 60P is a portion of the electrical conducting metallic nitride and/or oxide layer 60 that remains after the patterning process).

In this embodiment, a stacked metal-insulator-metal resistor is provided. In this embodiment, the base electrical conducting metallic nitride and/or oxide 56P and the electrical conducting metallic nitride and/or oxide 60P are both electrical conducting resistive materials of the resistor structure shown in FIG. 11.

As shown, outer sidewalls of each of the components of the resistor structure (56P/58P/60P) are vertically aligned with each other. Thus, the length of each of the components of the resistor structure (56P/58P/60P) is the same. In one embodiment, patterning may include lithography and etching, as defined above. In this embodiment, at least a portion of the stacked resistor structure (56P/58P/60P) is present directly above the at least one interconnect structure 52 that is embedded within the dielectric substrate 50 such that a bottommost surface of the stacked resistor structure (56P/58P/60P) is present on a topmost surface of the at least one interconnect structure 52.

Figure 12:
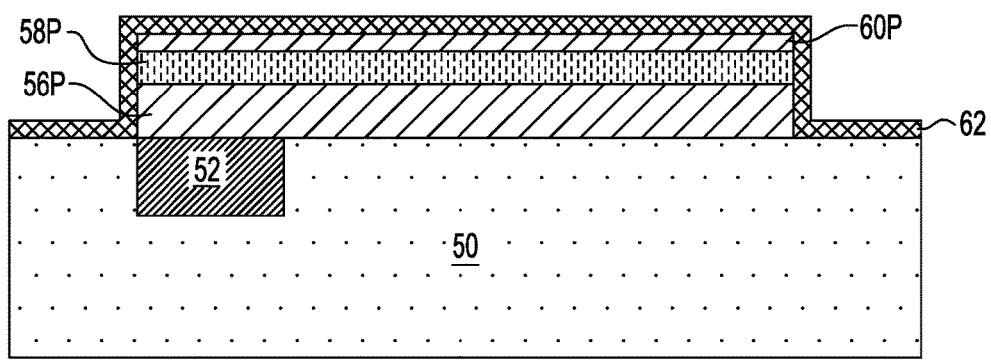
FIG. 12 is a cross sectional view of the second exemplary semiconductor structure of FIG. 11 after forming a dielectric capping layer on physically exposed portions of the substrate and the stacked resistor structure.

Referring now to FIG. 12, there is illustrated the second exemplary semiconductor structure of FIG. 11 after forming a dielectric capping layer 62 on physically exposed portions of the dielectric substrate 50 and the stacked resistor structure (56P/58P/60P). In some embodiments, the formation of dielectric capping layer 62 is omitted. The dielectric capping layer 62 may include one of the dielectric capping materials mentioned above for dielectric capping layer 16. Dielectric capping layer 62 may be formed utilizing one of the deposition processes mentioned above in forming dielectric capping layer 16. Dielectric capping layer 62 may have a thickness within the range mentioned above for dielectric capping layer 16.

Figure 13:
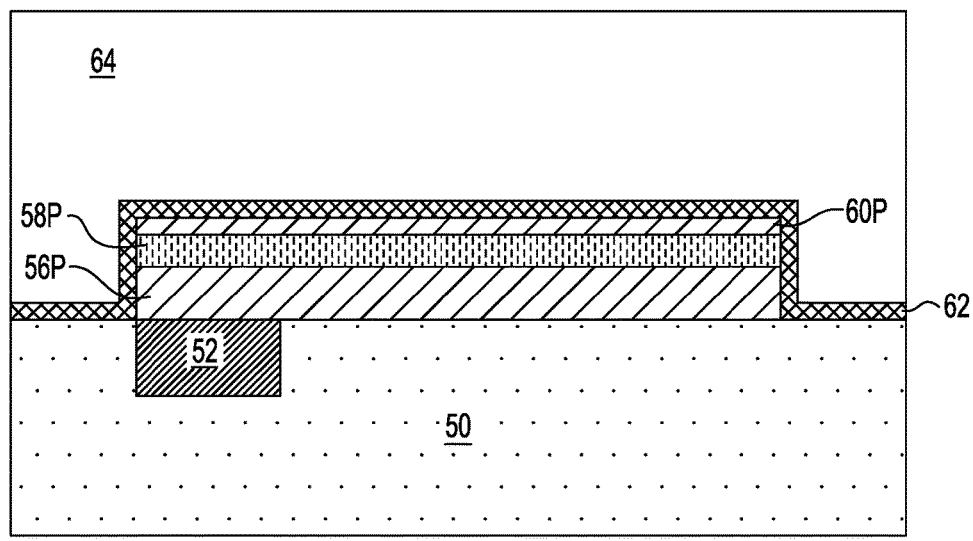
FIG. 13 is a cross sectional view of the second exemplary semiconductor structure of FIG. 12 after forming an interconnect dielectric material on the dielectric capping layer.

Referring now to FIG. 13, there is illustrated the second exemplary semiconductor structure of FIG. 12 after forming an interconnect dielectric material 64 on the dielectric capping layer 62. In embodiments in which the dielectric capping layer 62 is omitted, the interconnect dielectric material 64 may be formed on physically exposed portions of the dielectric substrate 50 and the stacked resistor structure (56P/58P/60P).

Interconnect dielectric material 64 may include one of the dielectric materials mentioned above for interconnect dielectric material 18. The dielectric material that provides interconnect dielectric material 64 may be the same as, or different from, the dielectric material that provides dielectric substrate 50.

Interconnect dielectric material 64 may be formed utilizing one of the deposition processes mentioned above in forming interconnect dielectric material 18. Interconnect dielectric material 64 may have a thickness within the range mentioned above for interconnect dielectric material 18.

Figure 14:
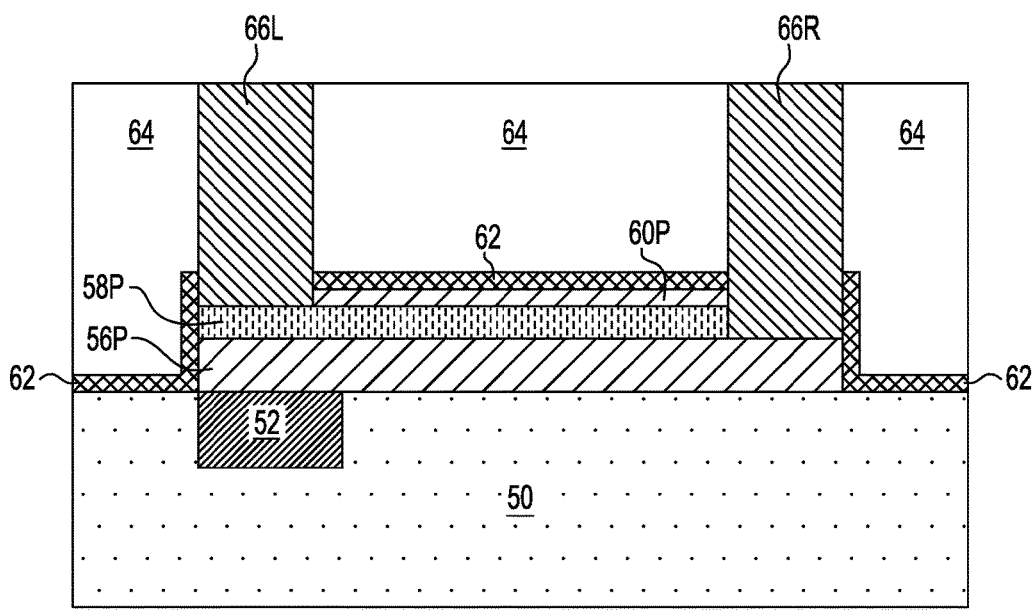
FIG. 14 is a cross sectional view of the second exemplary semiconductor structure of FIG. 13 after forming a first contact structure contacting a topmost surface of the remaining portion of the second doped metallic insulator layer of the stacked resistor structure and a second contact structure containing a topmost surface of the base electrical conducting metallic nitride and/or oxide layer of the stacked resistor structure.

Referring now to FIG. 14, there is illustrated the second exemplary semiconductor structure of FIG. 13 after forming a first contact structure 66L contacting a topmost surface of the remaining portion of the second doped metallic insulator layer (i.e., doped metallic insulator 58P of the stacked resistor structure) and a second contact structure 66R contacting a topmost surface of the base electrical conducting metallic nitride and/or oxide layer (i.e., base electrical conducting metallic nitride and/or oxide layer 56P) of the stacked resistor structure. In the illustrated embodiment, the first and second contact structures (66L, 66R) have a topmost surface that is coplanar with each other as well as coplanar with a topmost surface of the interconnect dielectric material 64.

The first and second contact structures (66L, 66R) can be formed by first providing contact openings utilizing lithography and etching, as defined above. Each contact opening is then filled with a contact metal or metal alloy as defined above for the first and second contact structures (20L, 20L) in the previous embodiment of the present application.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure, the method comprising:
   forming a doped metallic insulator layer having an insulating phase atop a substrate;
   performing a controlled surface treatment process to an upper portion of the doped metallic insulator layer to convert the upper portion of the doped metallic insulator layer into an electrical conducting resistive material layer having an electrical conducting phase, the electrical conducting resistive material layer is selected from the group consisting of a metallic nitride, a metallic oxide, and a metallic nitride-oxide;
   patterning the doped metallic insulator layer and the electrical conducting resistive material layer to provide a resistor structure comprising a remaining portion of the doped metallic insulator layer and a remaining portion of the electrical conducting resistive material layer; and
   forming an interconnect dielectric material on the substrate and the resistor structure.

2. The method of claim 1, wherein the controlled surface treatment process comprises a thermal process, a plasma process, a gas cluster ion beam process, an ion beam process or an ion implantation process.

3. The method of claim 1, further comprising forming a first contact structure and a second contact structure in the interconnect dielectric material and contacting different portions of a topmost surface of resistor structure.

4. The method of claim 1, wherein the controlled surface treatment process comprises a thermal process that is performed at a temperature from 50° C. to 600° C. and in an ambient containing at least one of nitrogen ($N_2$), oxygen ($O_2$), hydrogen ($H_2$), and argon (Ar).

5. The method of claim 1, wherein the controlled surface treatment process comprises a plasma process that is performed at a temperature from 50° C. to 600° C. and in an ambient containing at least one of nitrogen ($N_2$), oxygen ($O_2$), hydrogen ($H_2$), and argon (Ar).

6. The method of claim 1, wherein the controlled surface treatment process comprises an ion beam process in which an energy is from 10 eV to 100 eV is employed, and the ion beam contains at least one of nitrogen ($N_2$) ions, oxygen ($O_2$) ions, hydrogen ($H_2$) ions, and argon (Ar) ions.

7. The method of claim 1, wherein the controlled surface treatment process comprises a gas cluster ion beam process in which an energy is from 10 eV to 30 eV is employed, and the gas cluster contains at least one of nitrogen ($N_2$) ions, oxygen ($O_2$) ions, hydrogen ($H_2$) ions, and argon (Ar) ions.

8. The method of claim 1, wherein the controlled surface treatment process comprises an ion implantation process in which an energy is from 10 eV to 200 eV is employed, and the ion beam contains at least one of nitrogen ($N_2$) ions, oxygen ($O_2$) ions, hydrogen ($H_2$) ions, and argon (Ar) ions.

9. The method of claim 1, wherein the doped metallic insulator is a nitrogen doped metal, an oxygen doped metal or a nitrogen and oxygen doped metal.

10. The method of claim 9, wherein the metal is titanium (Ti), ruthenium (Ru), tungsten (W), platinum (Pt), cobalt (Co), rhodium (Rh) or manganese (Mn).

11. The method of claim 9, wherein the metal is tantalum (Ta).

12. The method of claim 11, wherein the electrical conducting resistive material is composed of tantalum nitride (TaN) and the doped metallic insulator is composed of $Ta_3N_5$.

13. A method of forming a semiconductor structure, the method comprising:
   forming a first doped metallic insulator layer having an insulating phase atop a substrate;
   performing a first controlled surface treatment process to the doped metallic insulator layer to convert an entirety of the first doped metallic insulator layer into a base electrical conducting resistive material layer having an electrical conducting phase,
   forming a second doped metallic insulator layer having an insulating phase atop the base electrical conductive resistive material layer;
   performing a second controlled surface treatment process to convert the upper portion of the second doped metallic insulator layer into an electrical conducting resistive material layer having an electrical conducting phase, the electrical conducting resistive material layer is selected from the group consisting of a metallic nitride, a metallic oxide, and a metallic nitride-oxide;
   patterning the base electrical conducting resistive material layer, the doped metallic insulator layer and the electrical conducting resistive material layer to provide a resistor structure comprising a remaining portion of the base electrical conducting resistive material, a remaining portion of the doped metallic insulator layer and a remaining portion of the electrical conducting resistive material layer; and
   forming an interconnect dielectric material on the substrate and the resistor structure.

14. The method of claim 13, wherein the base electrical conducting resistive material layer is selected from the group consisting of a metallic nitride, a metallic oxide, and a metallic nitride-oxide.

15. The method of claim 14, wherein the metallic nitride, a metallic oxide, or metallic nitride-oxide that provides the base electrical conducting resistive material comprises a metal that is the same as a metal present in the doped metallic insulator layer.

16. The method of claim 15, wherein the metal is tantalum (Ta).

17. The method of claim 15, wherein the metal is titanium (Ti), ruthenium (Ru), tungsten (W), platinum (Pt), cobalt (Co), rhodium (Rh) or manganese (Mn).

* * * * *